United States Patent [19]

Zucker

[11] Patent Number: 5,220,467
[45] Date of Patent: Jun. 15, 1993

[54] CIRCUIT ARRANGEMENT FOR REVERSING A MAGNETIC FIELD

[75] Inventor: Friedhelm Zucker, Mönchweiler, Fed. Rep. of Germany

[73] Assignee: Deutsche Thomson-Brandt GmbH, Hanover, Fed. Rep. of Germany

[21] Appl. No.: 720,797

[22] PCT Filed: Feb. 22, 1990

[86] PCT No.: PCT/EP90/00297
§ 371 Date: Jul. 19, 1991
§ 102(e) Date: Jul. 19, 1991

[87] PCT Pub. No.: WO90/10290
PCT Pub. Date: Sep. 7, 1990

[30] Foreign Application Priority Data
Mar. 4, 1989 [DE] Fed. Rep. of Germany ....... 3907057

[51] Int. Cl.$^5$ ...................... G11B 13/04; H02M 7/538
[52] U.S. Cl. ........................ 360/66; 369/13; 361/156
[58] Field of Search ............ 369/13, 146; 360/59, 360/66, 114; 361/143, 156, 152, 153

[56] References Cited

U.S. PATENT DOCUMENTS

| | | | |
|---|---|---|---|
| 4,410,926 | 10/1983 | Hafner et al. | 361/156 |
| 4,712,203 | 12/1987 | Saito et al. | 369/13 |
| 4,748,605 | 5/1988 | Sakai et al. | 369/13 |
| 5,157,641 | 10/1992 | Lehureau | 369/13 |
| 5,163,032 | 11/1992 | Van Nieuwland et al. | 369/13 |

FOREIGN PATENT DOCUMENTS 0312143 4/1989 European Pat. Off. .
2184625 6/1987 United Kingdom .

Primary Examiner—Paul M. Dzierzynski
Assistant Examiner—Jim Beyer
Attorney, Agent, or Firm—Max Fogiel

[57] ABSTRACT

At magneto-optical recording- and reproducing equipment is provided an electromagnet, in order to be able to remagnetize the magneto-optical layer of a magneto-optical record in dependence of Bits to be stored.

In order to achieve a fast and safe reversal of the magnetic field, two series circuits consisting of a first and a second diode (D1, D2), a series circuit consisting of a third and a fourth diode (D3, D4) and a DC-voltage source (U) are connected in parallel to each other. The common terminal (A) of the first and second diode (D1, D2) are connected via a coil (L) with the common terminal (B) of the third and fourth diode (D3, D4). The second diode (D2) is bypassed by a first variable switch (S1) and the fourth diode (D4) is bypassed by a second variable switch (S2). The terminal (A) of the coil (L) is connected via a third variable switch (S3) and the other terminal (B) via a fourth variable switch (S4) with one input of a current sensor (SF), whose other input is connected with the common connecting point of the first and third diode (D1, D3). The output of the current sensor (SF) is connected with the input of a control circuit (S), whose outputs (A1, A2, A3, A4) are connected with the control inputs of the variable switches (S1, S2, S3, S4). The diodes (D 1, D2, D3, D4) are polarized in blocking direction with the DC-voltage source (U).

7 Claims, 4 Drawing Sheets

CIRCUIT ARRANGEMENT FOR REVERSING A MAGNETIC FIELD

BACKGROUND OF THE INVENTION

The invention concerns circuitry for reversing a magnetic field.

Circuitry for this type is employed for example in magneto-optical recording- and -playback equipment to reverse the magnetism in the magnetic layer of magneto-optical software.

A known magneto-optical software is the magneto-optical disc, at which a magneto-optical layer is behind a light-transmissive layer, on the magneto-optical layer information can be recorded and recalled from. How the information is recorded on a magneto-optical disc will now be described.

A laser beam is focused on the disc and heats the magneto-optical layer to a temperature in the vicinity of its Curie point. It is, however, usually sufficient to heat the layer only to approximately its compensation temperature, which is below the Curie temperature. An electromagnet is positioned beyond the focal point on the disc and magnetizes the area heated by the laser beam in one direction or the other. Since the heated area cools down to below the compensation temperature again once the laser beam is turned off, the magnetic orientation by the electromagnet is retained. It freezes in, so to speak. The individual bits are accordingly stored in domains of different magnetic orientation. One orientation corresponds for example to a domain of logical ONE and the other to a domain of logical ZERO.

The Kerr effect is exploited to recall the information. The plane of polarization of a linearly polarized beam of light is rotated while being reflected in a magnetized mirror around a measurable angle. The plane of polarization of the reflected beam of light is rotated right or left in accordance with the magnetic orientation of the mirror. Since, however, the individual domains on the disc act like magnetized mirrors, the plane of polarization of a beam of light that scans the domains will be rotated right or left around a measurable angle in accordance with the magnetic orientation of the domain just scanned.

From the angle of rotation of the plane of polarization of the beam of light reflected from the disc, an optical pick-up can determine whether the bit that is present is a ONE or a ZERO.

One known solution for magnetizing the magneto-optical layer in one direction or the other provides a circuit arrangement that acts as an electromagnet with a coil behind the magneto-optical disc. The coil is to be of such a size that it has the capacity to remagnetize the entire area scanned by the optical pick-up means. This area will be, depending on the type of recording and playback equipment, for example, a radial or circular-segmental strip which extends from disc edge to disc center. As the field strength must attain a minimum value over the entire strip in order to remagnetize the strip, the cross-section and therewith the inductivity will be relatively large.

In another known solution, the coil is affixed to the optical pick-up means. The coil can be wound around the objective lens of the optical pick-up for example. Owing to the fact that in this solution the coil together with the optical pick-up is guided along the data tracks on the magneto-optical disc by means of a tracking circuit, a smaller cross-section and therefore a smaller inductance are sufficient for generating the same minimum field strength because it is not a radial or circular-segmental strip but rather only a small, for example circular-shape area with the virtually point form laser spot as center that needs to be remagnetized in the magneto-optical layer.

A circuit arrangement for the rapid reversal of a magnetic field is known from GB-A-2 184 625.

A series circuit consisting of a first and a second diode, and a series circuit consisting of a third and a fourth diode as well as a direct voltage source, are connected parallel to each other. The common terminal of the first and the second diodes is connected via a coil with the common terminal of the third and fourth diodes. Each of the first through fourth diodes, all of which are polarized in the blocking direction to the direct voltage source, is bypassed by a controllable switch. A fifth diode, which is polarized in the transmitting direction to the direct voltage source, is located between the common terminal point of the first and third diodes and the direct voltage source. A capacity is provided parallel to the direct voltage source.

Although this circuit arrangement achieves a rapid reversal of the coil's magnetic field, the time taken to reverse the magnetic field can be even further reduced by the use of appropriate measures.

It is therefore the object of the invention to set up a circuit arrangement according to the preamble of claim 1 so that a reliable and quick reversal of the magnetic field is effected.

The invention solves this task by means of the features given in claim 1.

The drawings show:

FIG. 1 through FIG. 4 a first embodiment example for various switching states,

FIG. 5 a second embodiment example,

FIG. 6 an embodiment example of a control circuit for controlling the controllable switch, FIG. 7 a diagram in which the control signals for the controllable switches as well as the flow path of the current and the voltage at the coil are plotted against the time.

The invention is now described and illustrated by means of the FIGS. 1 through 4.

DETAILED DESCRIPTION OF THE INVENTION

Figure 1:
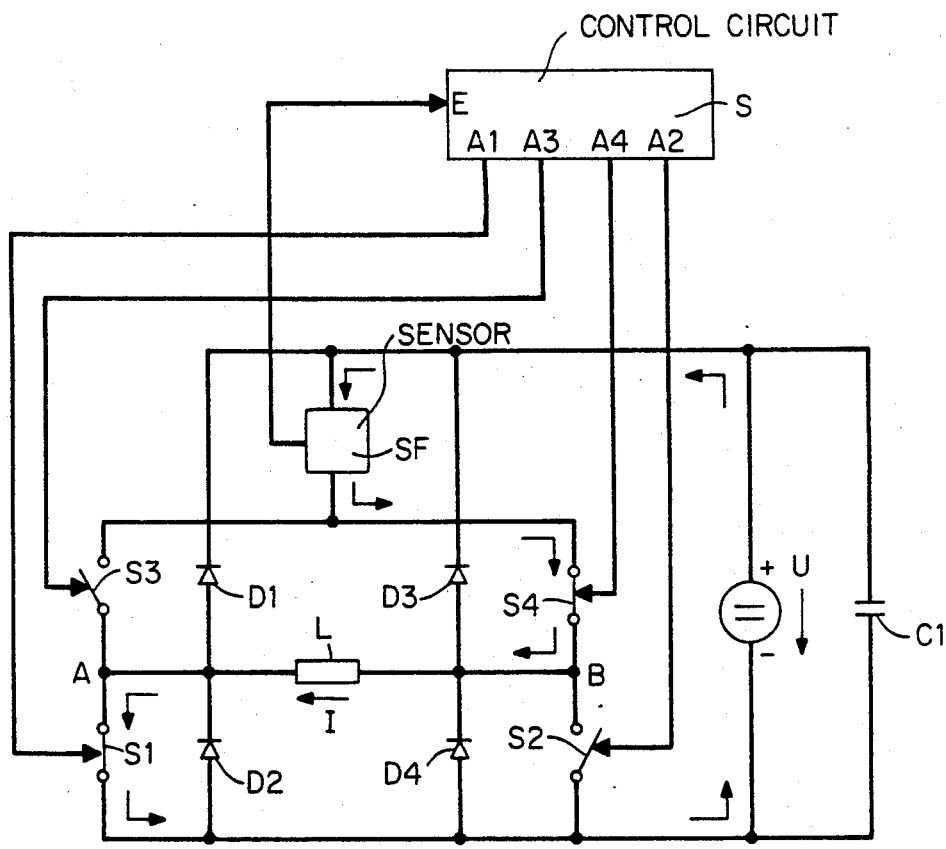

According to FIG. 1 are a series circuit consisting of two diodes D1 and D2, a series circuit consisting of two diodes D3 and D4, a DC voltage source U and a capacity C1 parallel to each other. The common terminal point A for the diodes D1 and D2 is connected via a coil L with common terminal B of the diodes D3 and D5. The diode D2 is bypassed by a variable switch S1, the diode D4 is bypassed by a variable switch S2. The common terminal A of the diodes D1 and D2, of the variable switch S1 and the coil L is connected with the one terminal of a current sensor SF via a controllable switch S3. The common terminal B of the diodes D3 and D4, of the variable switch S2 and the coil L is also connected with the one terminal of the current sensor SF via a variable switch S4, whose other terminal is connected with the common connecting point of the diodes D1 und D3, the voltage source U and the capacity C1. The outputs A1 through A4 of a control circuit S, whose input E is connected with the output of the current sensor SF, are connected with the control inputs of the variable switches S1 through S4. The current sensor SF can be executed e.g. as a threshold detector. For improved viewing the control circuit S is not illustrated in the FIGS. 1 through 4.

The order of opening and closing of the variable switches S1 through S4 by the control circuit S for reversal of the magnetic field generated by the coil L, will now be explained refering to the FIGS. 1 through 4.

In FIG. 1 the controllable switches S1 and S4 are closed, while the variable switches S2 and S3 are opened. Therefore a current I starts to flow from the positive pole of the voltage source U via the current sensor SF, the controllable switch S4, the coil L and the variable switch S1 to the negative pole of the DC voltage source. As soon as this fast increasing current reaches a pre-selectable threshold, the current sensor SF gives a signal to the control circuit S, which now causes that the variable switch S4 opens. Hence the potential of the connecting point B drops sharply, until finally the diode D4 starts to conduct.

Figure 2:
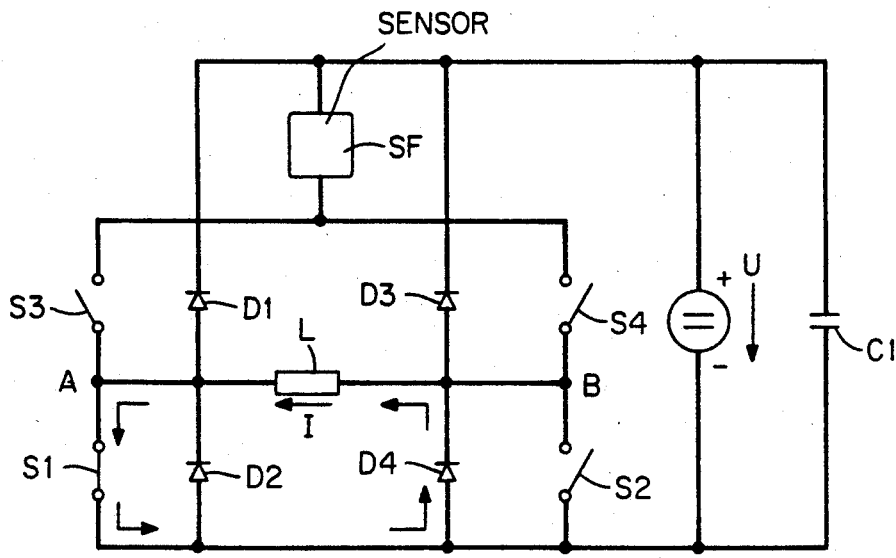

In this state, which is shown in FIG. 2, the current I flows in the same direction through the coil L in the loop, which is formed by the coil L, the variable switch S1 and the diode D4.

Figure 3:
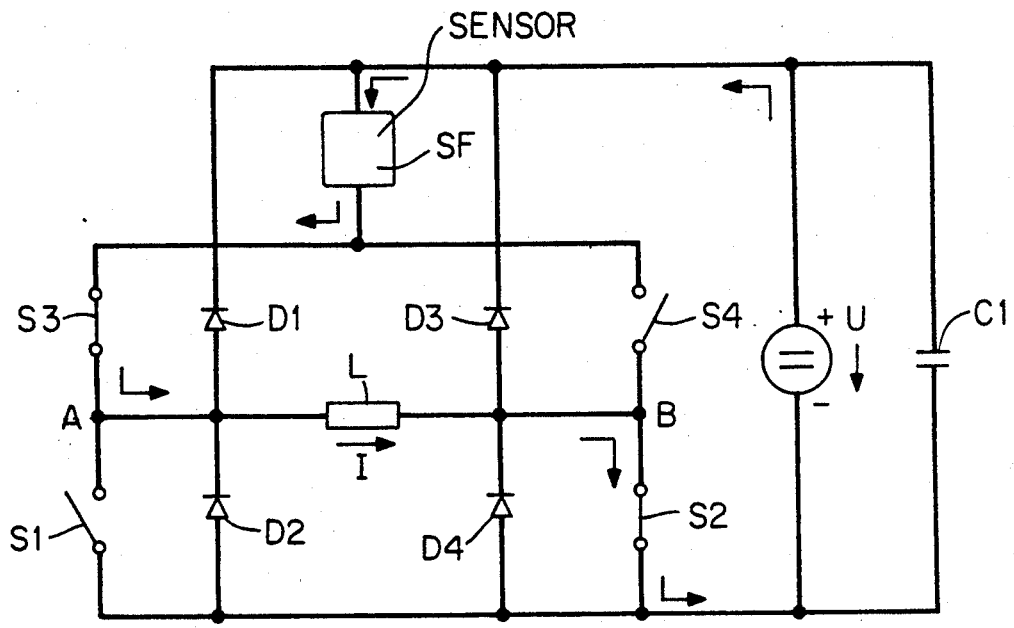

For the reversal of the magnetic field the variable switches S2 and S3 are being closed as shown in FIG. 3, the variable switch S1 however will be opened. The voltage at the connecting point A jumps up, such that the current I now flows from the positive pole of the DC voltage source U via the current sensor SF, the controllable switch S3, the coil L and the variable switch S2 to the negative pole of the DC voltage source U. As soon as the current I reaches the pre-given threshold value, the current sensor SF supplies a signal to the control circuit S, which opens the variable switch S2. Because the voltage at the connecting point A drops suddenly, the diode D2 starts to conduct.

Figure 4:
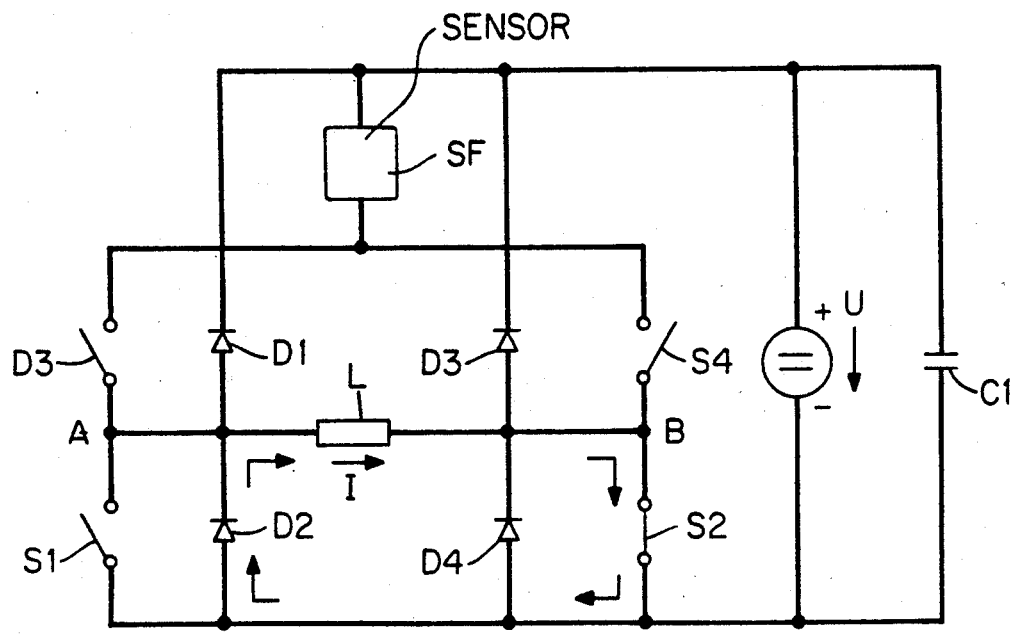

In this state, shown in FIG. 4, the current I flows furtheron in the same direction through the coil L in the loop, which is formed by the coil L, the diode D2 and the variable switch S2.

In order to reverse the direction of the magnetic field again, the variable switch S2 is opened, the variable switches S1 and D4 closed however. Now the state shown in FIG. 1 is reached once more.

In order to reverse the direction of the magnetic field for instance cyclicly, the switching functions explained, when refering to the FIGS. 1 through 4, are being repeated by the control circuit S cyclicly.

An essential advantage of the invention is that the voltage of the DC voltage source U can be choosen very highup to several hundred volts. Due to the high voltage a very fast reversal of the current and therefore of the magnetic field can be achieved. Besides the high voltage the circuit arrangement according to the invention consumes only little energy, because at the reversal of the direction of current the coil L feeds the stored energy back to the voltage source U or to the capacity C1 connected in parallel.

Figure 5:
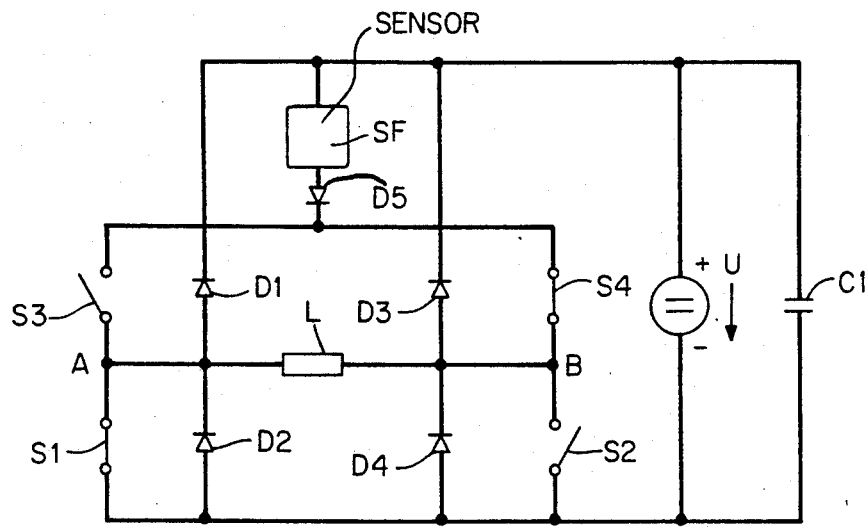

In FIG. 5 a first example according to the invention is shown, that differs from the circuit arrangement of FIG. 1 in that a diode D5 is provided in a connecting branch of the current sensor. This diode D5 prohibits that the current can flow in the wrong direction through the current sensor SF.

Figure 6:
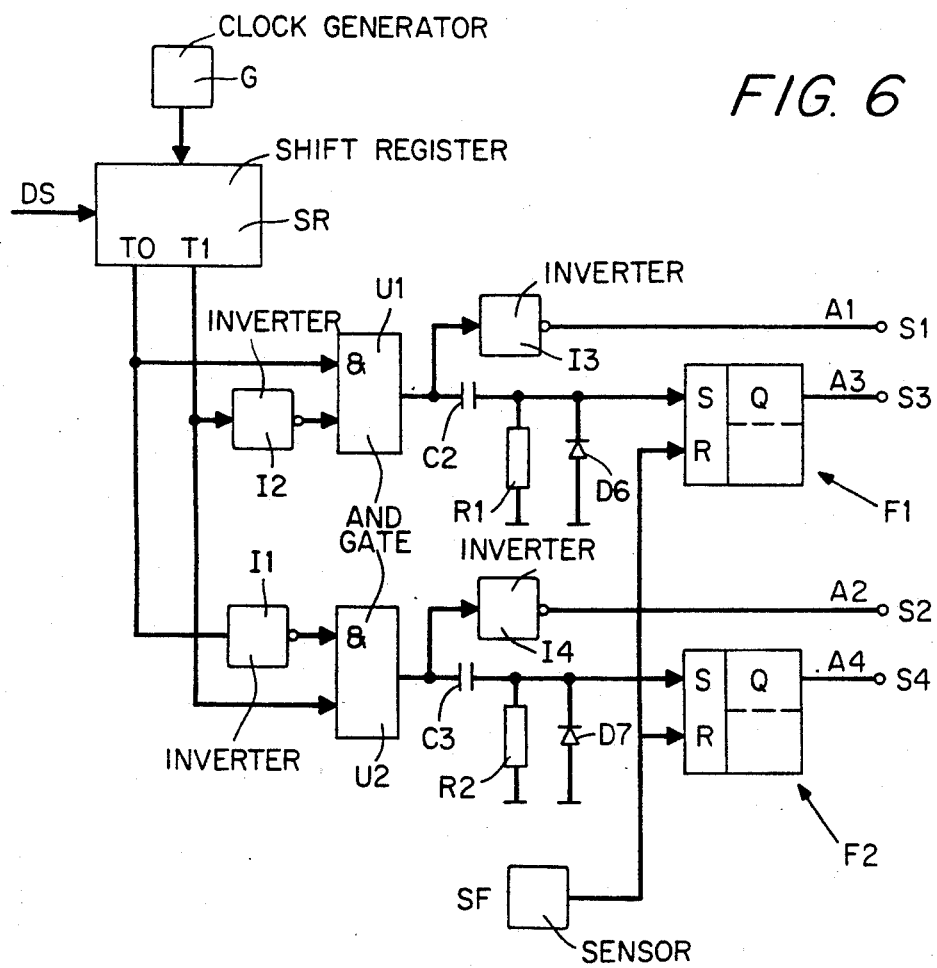

The example, shown in FIG. 6, of a control circuit for controlling the variable switches S1 through S4 will be first described and following it will be explained refering to the puls diagram shown in FIG. 7.

As mentioned already, the invention is suited for the reversal of magnetization of the magnetic layer of a magneto-optical software.

The digital data signal DS to be recorded on a magneto-optical record is supplied to the data input of a shift register SR, which is clocked by a clock generator G. The first output T0 of the shift register SR, at which the undelayed data signal can be taken from, is connected with the first input of a AND-gate U1 and via a first inverter I1 with the first input of a AND-gate U2. The second output T1 of the shift register SR, at which the undelayed data signal can be taken from, is connected with the second input of the AND-gate U2 and via an inverter I2 with the second input of the AND-gate U1. The output of the AND-gate U1 is connected with the input of an inverter I3 and via a capacity C2 with the set-input of a RS-flip-flop F1. The output of the AND-gate U2 is connected with the input of an inverter I4 and via a capacity C3 with the set-input of a RS-flip-flop F2. The set-inputs of both RS-flip-flops F1 and F2 are connected via a parallel circuit consisting of a resistor R1 resp. R2 and a diode D6 resp. D7 with reference potential. The output of the current sensor SF is connected with the reset-input of both RS-flip-flops F1 and F2. At the output of the inverter I3 the control signal for the variable switch S1 at the output of the inverter I4, the control signal can be taken for the variable switch S2, at the Q-output of the RS-flip-flop F1 the control signal can be taken for the variable switch S3 and finally at the Q-output of the RS-flip-flop F2 the control signal can be taken for the variable switch S4.

The differentiating member consisting of the resistor R1 and the capacity C2 serves to shorten the pulses at the output of the AND-gate U1. Likewise the pulses at the output of the AND-gate U2 are shortened by the differentiating member consisting of the resistor R2 and the capacity C3. The diodes D6 and D7 prohibit the differentiating of falling edges, if the signal at the output of both AND-gates U1 und U2 change from "HIGH" to "LOW". The shortening of the pulses caused by both differentiating members at the outputs of both AND-gates U1 and U2 is necessary to make shure that the set-inputs of both RS-flip-flops F1 and F2 are always at "LOW", when the RS-flip-flops receive a reset-puls from the current sensor SF.

Figure 7:
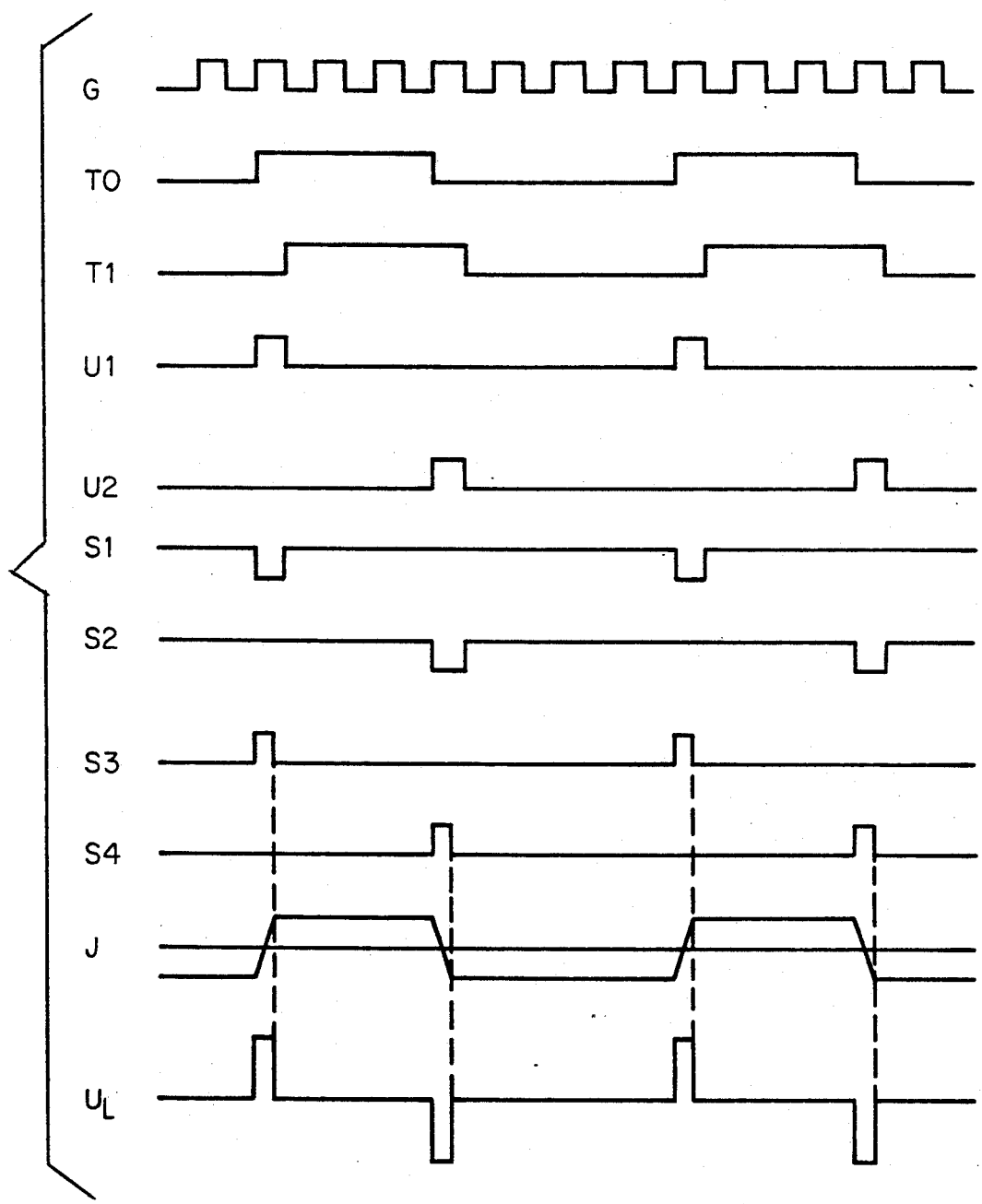

The puls diagram of FIG. 7 shows the clock G for the shift register SR, for the undelayed data signal DS and for the delayed data signal TS, which is delayed by one clock. The direction of the current I is to be reversed at each edge of the data signal DS, which flows through the coil L. The AND-gate U1 delivers now at each rising edge of the data signal DS a puls, which opens the variable switch S1 after inversion by the inverter I3 for the duration of the puls. Because at the same time the RS-flip-flop F1 is being set by the puls at the output of the AND-gate U1, the variable switch S3 will be closed. However as soon as the magnitude of current I through the coil L reaches the pre-given threshold value, the RS-flip-flop F1 will be reset by the current sensor SF and hereby the variable switch S3 will be opened.

At each falling edge of the data signal DS the AND-gate U2 delivers a puls, which, inverted by the inverter I4, opens the variable switch S2 for the duration of the puls. The variable switch S4 will be closed at the same time, because the RS-flip-flop F2 will be set by the puls at the output of the AND-gate U2. If the value of the current I through the coil L reaches the pre-given threshold value, the current sensor SF resets the RS-flip-flop F2 in order re-open the variable switch S4. The voltage at the coil L increases puls-like at each rising edge of the data signal DS, at a falling edge of the data signal DS however it assumes the shape of a negative puls. The current I changes due to the coil L in magnitude and direction depending on the data signal DS: At a rising edge in the data signal DS the current I rises, which flows through the coil L from the lower threshold value fast to the upper, while the same falls at a falling edge by the same speed from the upper threshold value to the lower threshold value having the equal amount. The current passing the current sensor SF changes depending on the data signal DS only by its amount, the direction remains but the same. At each edge of the data signal DS the current rises fast to the selected threshold set at the current sensor SF, which is a threshold detector, for dropping then suddenly to the value zero.

The invention offers at magneto-optical recording- and reproducing equipment the advantage, that already recorded data on the magneto-optical record can be copied directly. However at known magneto-optical recording- and reproducing equipment the old data are erased firstly, before new data are recorded.

In order to achieve this magneto-optical layer is heated up by the laser to the compensation temperature at those spots, where new data are to be stored. This way these spots are magnetized in one direction. The record will be initiated, as the term exists for the procedure. Subsequently the direction of the magnetic field generated in the coil is again reversed.

For the recording of new data the laser power is being switched between a low and a high value depending on the Bit to be stored. If at the before erased spot e.g. a logic ZERO will be stored, then the laser operates with the low power, in order not do reach the compensating temperature. For recording of a logic ONE however the laser heats the spot to be recorded up to the compensation temperature, in order to allow re-magnetizing of this spot by the coil. In this complicated way data on the magneto-optical record are at first erased, before following the new data are recorded.

The invention is not only suited for magneto-optical equipment, but also for other magnetic recording equipment.

I claim:

1. A circuit arrangement for reversing a magnetic field generated by a coil comprising: a first series circuit having a first diode and a second diode; a second series circuit having a third diode and a fourth diode; a source of direct voltage, said first series circuit, said second series circuit and said source of direct voltage being connected in parallel to each other; a first junction connecting said first diode to said second diode; a second junction connecting said third diode to said fourth diode; a coil for generating said magnetic field connected between said first junction and said second junction; a first controllable switch for bypassing said second diode; a second controllable switch for bypassing said fourth diode; said first junction and said second junction being connectable to each other through a third controllable switch and a fourth controllable switch, all of said diodes being polarized in a blocking direction to said source of direct voltage; a current sensor located between a common connection point of said first and said third diodes and a common connection point of said third and said fourth controllable switches; a control circuit with input connected to an output of said current sensor; each said controllable switch having a control input connected to an output of said control circuit; said first and said fourth controllable switches being closed in a first process step while said second and said third controllable switches are open; said fourth controllable switch being open in a second process step when current passing through said coil exceeds a predeterminable threshold value; said first controllable switch being open in a third process step for reversing current in said coil in a third process step while said second and said third controllable switches are closed; said third controllable switch being open in a fourth process step when the current through said coil exceeds said predeterminable threshold value; said second controllable switch being open for reversing the current through said coil in a fifth process step while said first and said fourth controllable switches are closed.

2. A circuit arrangement as defined in claim 1, wherein said control circuit repeats process steps two through five in a cycle for cyclic reversal of the current through said coil.

3. A circuit arrangement as defined in claim 1, including a first capacitor connected in parallel to said source of direct voltage.

4. A circuit arrangement as defined in claim 1, including a fifth diode connected in series with said current sensor and having a transmitting direction polarized for said source of direct voltage.

5. A circuit arrangement as defined in claim 1, wherein said current sensor comprises a threshold value detector.

6. A circuit arrangement as defined in claim 1, including a shift register and a pulse generator for supplying clock pulses to said shift register; a logic circuit coupling signal outputs of said shift register with an output signal of said current sensor; said logic circuit having outputs providing control signals for all of said controllable switches.

7. A circuit arrangement as defined in claim 6, including a first AND gate with a first input connected to a first output of said shift register; a second AND gate with a first input; a first invertor connected between said first input of said second AND gate and said first output of said shift register; said shift register having a second output connected to a second input of said second AND gate; a second invertor connected between said second output of said shift register and a second input of said first AND gate; a third invertor with input connected to an output of said first AND gate; a first RS flip-flop with a set input connected to said output of said first AND gate through a second capacitor; a fourth invertor with input connected to an output of said second AND gate; a second RS flip-flop with a set input connected to said output of said second AND gate through a third capacitor; said set input of said first RS flip-flop being at reference potential through a first resistor connected in parallel with a sixth diode; said set input of said second RS flip-flop being at reference potential through a second resistor connected in parallel with a seventh diode; said first flip-flop and said second flip-flop each having a reset input connected to the output of said current sensor; said third invertor having an output connected to the control input of said first controllable switch; said fourth invertor having an output connected to the control input of said second controllable switch; said first RS flip-flop having a Q-output connected to the control input of said third controllable switch; said second RS flip-flop having a Q-output connected to the control input of said fourth controllable switch.

* * * * *